United States Patent [19]
Ventrudo et al.

[11] Patent Number: 6,044,093
[45] Date of Patent: *Mar. 28, 2000

[54] FIBRE-GRATING-STABILIZED DIODE LASER

[75] Inventors: Brian F. Ventrudo; Grant Rogers, both of Victoria, Canada

[73] Assignee: SDL, Inc., San Jose, Calif.

[ * ] Notice: This patent is subject to a terminal disclaimer.

[21] Appl. No.: 08/991,665

[22] Filed: Dec. 16, 1997

Related U.S. Application Data

[63] Continuation of application No. 08/575,705, Dec. 19, 1995, Pat. No. 5,715,263, which is a continuation of application No. 08/267,785, Jun. 28, 1994, Pat. No. 5,485,481.

[51] Int. Cl.$^7$ .............................................. H01S 3/10
[52] U.S. Cl. ......................... 372/6; 372/29; 372/96; 372/102; 372/108; 385/10; 385/37
[58] Field of Search ................... 372/6, 22, 29, 372/96, 99, 108, 102, 32; 385/2, 10, 28, 31, 33, 37

[56] References Cited

U.S. PATENT DOCUMENTS

| | | | |
|---|---|---|---|
| 4,639,922 | 1/1987 | Miller | 372/19 |
| 4,786,132 | 11/1988 | Gordon | 385/37 |
| 4,963,832 | 10/1990 | Desurvire et al. | 330/4.3 |
| 5,185,752 | 2/1993 | Welch et al. | 372/22 |
| 5,309,260 | 5/1994 | Mizrahi et al. | 385/37 |
| 5,321,718 | 6/1994 | Waarts et al. | 372/99 |
| 5,430,817 | 7/1995 | Vengsarkar | 385/28 |
| 5,457,760 | 10/1995 | Mizrahi | 385/2 |
| 5,471,490 | 11/1995 | Liedenbaum et al. | 372/32 |
| 5,488,475 | 1/1996 | Friebele et al. | 372/6 |
| 5,563,732 | 10/1996 | Erdogan et al. | 395/134 |

OTHER PUBLICATIONS

C. R. Giles et al., "Simultaneous Wavelength–Stabilization of 980–nm Pump Lasers", OSA & IEEE Conference on Optical Amplifiers and Their Applications, pp. PD11–1 to PD11–4, Jul. 4–6, 1993, Yokohama, Japan.

D. L. Williams et al., "Temperature Stable 1.3 $\mu$m Laser With Bragg Fibre Grating External Cavity for Access Networks", TU11, pp. 209–212 (1993) (no month available).

E. Brinkmeyer et al., "Fibre Bragg Reflector for Mode Selection and Line–Narrowing of Injection Lasers", *Electronics Letters*, vol. 22(3), pp. 134–135, Jan. 30, 1986.

Jens Buus, "Single Frequency Semiconductor Lasers", SPIE Optical Engineering Press,, vol. TT5 (10), pp. 81–90, (1991) (no month available).

B.F. Ventrudo et al., "Wavelength and Intensity Stabilization of 980 nm Diode Lasers Coupled to Fibre Bragg Gratings", Electronic Letters, vol. 30(25), pp. 2147–2148, Dec. 8, 1994.

K.O. Hill et al, "Bragg Gratings Fabricated in Monomode Photosensitive Optical Fiber by UV Exposure Through a Phase Mask", Applied Physics Letters, vol. 62 (10), pp. 1035–1037 (Mar. 8, 1993).

R.J. Horley et al., "System Measurements Using a Miniature Packaged Narrow Linewidth Fiber Grating Laser", Optical Fiber Conference '92, Poster Preview: System Technologies, p. 166, (1992) (no month available).

(List continued on next page.)

*Primary Examiner*—Rodney Bovernick
*Assistant Examiner*—Yisun Song
*Attorney, Agent, or Firm*—W. Douglas Carothers, Jr.

[57] ABSTRACT

A fiber Bragg grating is used to stabilize the intensity and frequency fluctuations of a diode laser. The diode laser is connected with an opto-mechanical apparatus to the fiber which contains the grating. The grating is formed in the guided-mode region of the optical fiber. The wavelength of maximum grating reflectivity is selected to lie near the maximum of the diode laser gain bandwidth. The magnitude and bandwidth of the grating reflectivity stabilizes the diode laser output without appreciably reducing the optical output power from the end of the fiber. The bandwidth of the optical spectrum of the diode laser is selected depending on the distance of the grating from the diode laser.

34 Claims, 2 Drawing Sheets

OTHER PUBLICATIONS

G.D. Maxwell et al., "Semiconductor External–Cavity Laser With a UV–Written Grating in a Planar Silica Waveguide", Optical Fiber conference '94, pp. 151–152, (1994) (no month available).

G. Meltz et al., "Formation of Bragg Gratings in Optical Fibers by a Transverse Holographic Method", Optics Letters, vol. 14 (15), pp. 823–825, Aug. 1, 1989.

P.A. Morton et al., "High–Power, Narrow–Linewidth, Stable Single–Mode Hybrid Laser", Optical Fiber Conference '94, pp. 102–103, (1994) (no month available).

CA.A. Park et al., "Single–Mode Behavior of a Multimode 1.55 Micron Laser with a Fibre Grating External Cavity", Electronics Letters, vol. 22(21), pp. 1132–1133, Oct. 9, 1986.

R.W. Tkach et al., "Regimes of Feedback Effects in 1.5 Micron Distributed Feedback Lasers", Journal of Lightwave Technology, vol. LT–4 (11), pp. 1655–1661, Nov., 1986.

K.Y. Liou et al., "Narrow Linewidth Fibre External Cavity Injections Lasers", Electronics Letters, pp. 933–934, Sep. 26, 1985.

M. Ojima et al., Diode Laser Noise at Video Frequencies in Optical Videodisc Players, Applied Optics, pp. 1404–1410, May 1, 1986.

T. Ikegami et al., "Optical Fiber Amplifiers", SPIE, Physical Concepts of Materials for Novel Optoelectronic Device Applications II, Device Physics and Applications, vol. 1362, pp. 350–360, Oct. 28, 1990–Nov. 2.

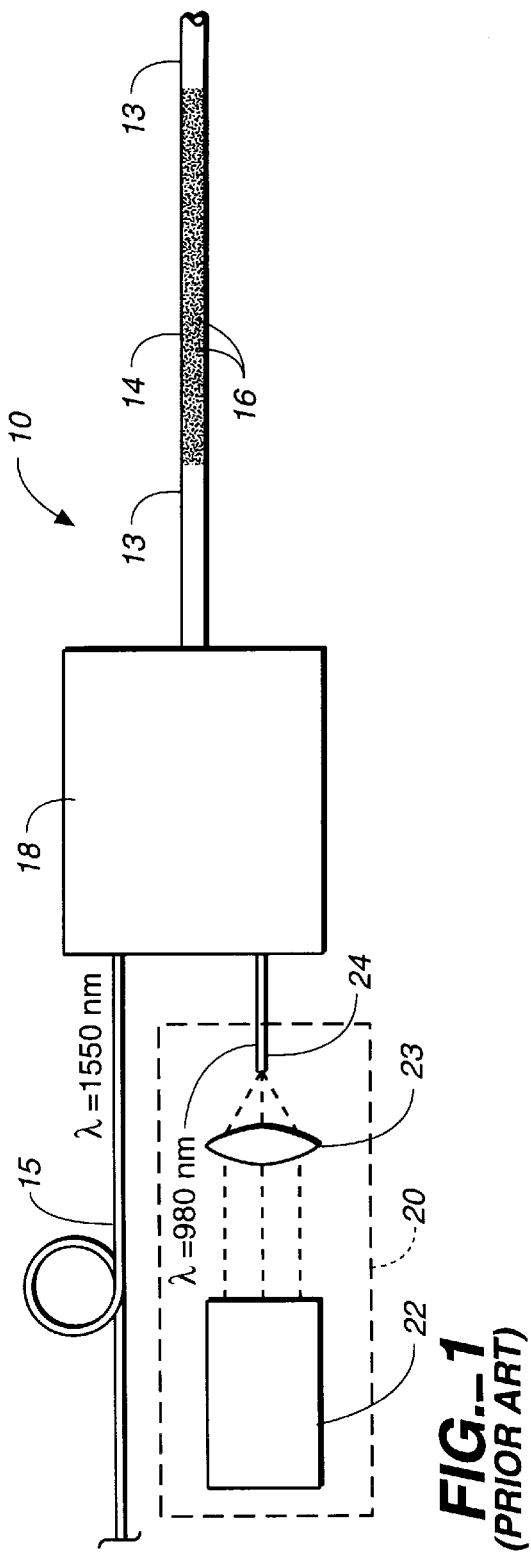
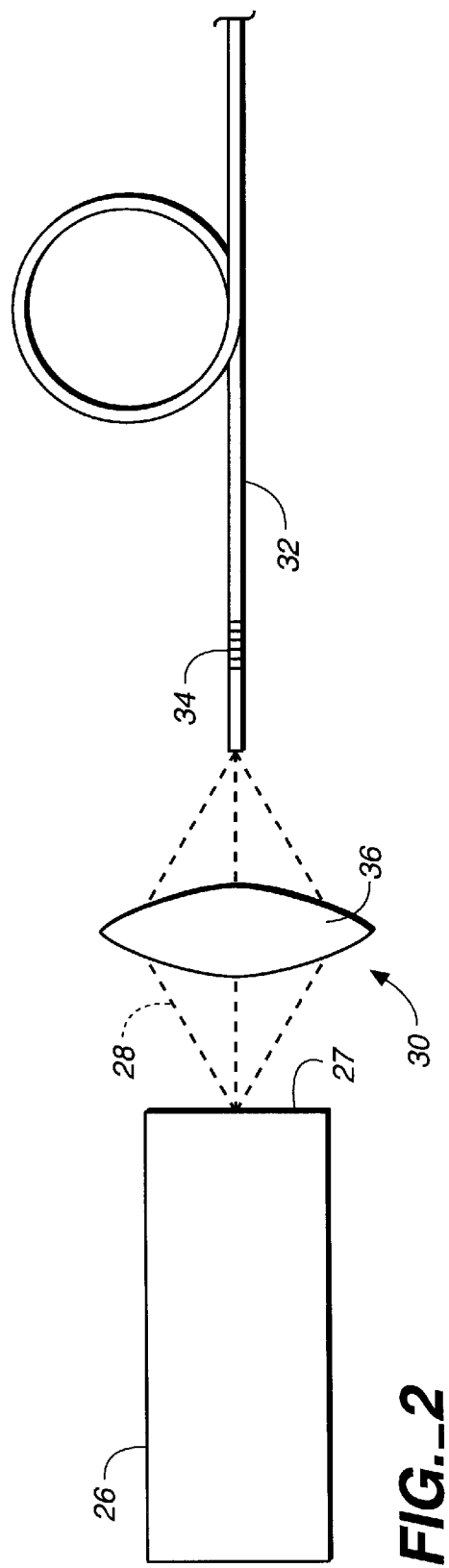

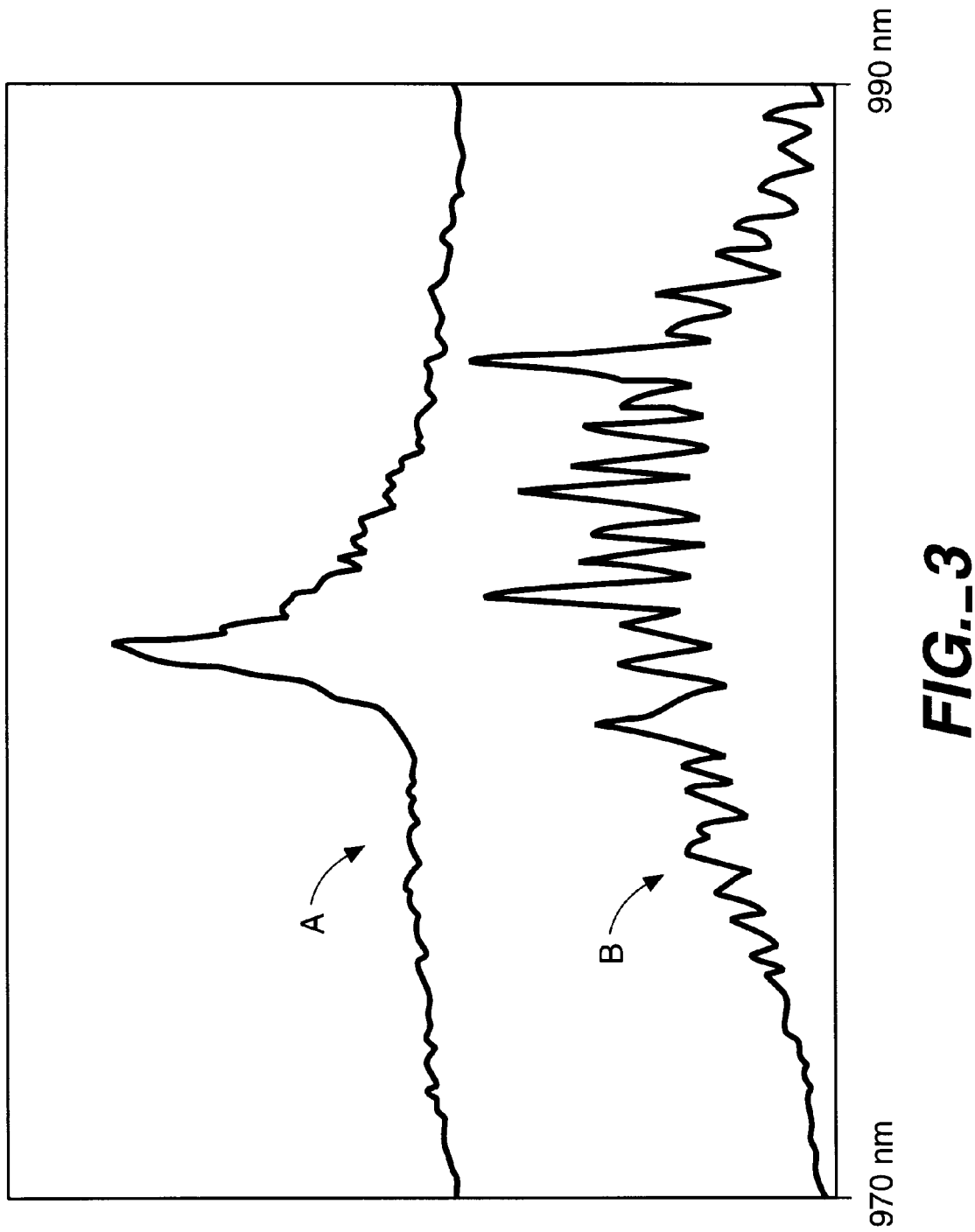
FIG._3

FIBRE-GRATING-STABILIZED DIODE LASER

REFERENCE TO RELATED APPLICATIONS

This application is a continuation of patent application Ser. No. 08/575,705, filed Dec. 19, 1995, now U.S. Pat. No. 5,715,263, which is a continuation of patent application Ser. No. 08/267,785, filed Jun. 28, 1994, now U.S. Pat. No. 5,485,481.

FIELD OF THE INVENTION

The present invention is a stabilized laser source which provides narrow-bandwidth high-power optical radiation with stable intensity and wavelength suitable, for example, for optically pumping solid-state fiber amplifiers or lasers such as fiber lasers.

BACKGROUND OF THE INVENTION

Optical fiber amplifiers and lasers have rapidly become important components of optical communications systems. Optical fiber amplifiers are used to intensify optical signals that are attenuated along the fiber-optic communication path. The have replaced cumbersome electrical repeaters in fiber-optic communication links allowing true all-fiber optical communications systems to be realized. Similarly, optical fiber lasers have been proposed to generate an optical carrier for fiber-optic communications systems. These lasers can be externally modulated or mode locked, and in some cases are an alternative to diode lasers as sources of high-power light in fiber optic communications systems.

Both fiber amplifiers and lasers operate on similar principles. The silica glass in the guided-wave portion of the optical fiber is doped with ions of rare-earth element such as, for example, erbium. The energy structure of the erbium ions is such that signal light with wavelengths of approximately 1530–1565 nm can be amplified in the fiber if the population of the excited states of the erbium ions is such that rate of stimulated emission exceeds that of spontaneous emission and absorption. In such a circumstance, light within the gain bandwidth entering the optical fiber will experience net gain, and will exit the fiber with greater power. If a mechanism is established to recirculate this amplified signal in the fiber, for example by placing the appropriate reflectors at the ends of the fiber, then laser action can occur in the fiber if the net gain equals the loss of the light within some optical bandwidth. In either case, it is crucial to excite the erbium ions into the proper excited state for gain to occur. This can be accomplished by exciting (pumping) the erbium ions with light near wavelengths of 980 nm, which is most conveniently provided by a high-power diode laser that is couple into the guided-wave portion of the optical fiber. The relatively small cross-sectional area of this portion helps to ensure high intensity and therefore allows appreciable gain of the signal wavelengths. However, those skilled in the art will appreciate that the properties of the signal produced by such an amplifier or laser will depend to a large extent on the properties of the diode laser used to pump the fiber itself.

In a practical system, the diode lasers are permanently and robustly connected with an opto-mechanical apparatus to a length of undoped optical fiber which in turn is connected to the doped fiber in the optical amplifier or laser. The assembly consisting of the diode laser, opto-mechanical apparatus and optical fiber is called a pigtailed diode laser. Presently, many pigtailed diode lasers have undesirable characteristics such as wavelength and intensity instabilities that create noise in the pumped system. The most troublesome sources of diode laser noise in the 980 nm diode lasers are mode-hopping noise and wavelength fluctuations that are caused by unwanted variable optical feedback into the diode laser or changes in temperature or injection current. The noise is especially detrimental in fiber amplifiers because it increases errors in the amplified optical communication signal and detracts from the practicality of these devices.

There are many techniques to reduce the effect of such diode laser noise. An example is an active electrical system that detects the variation in output of the fiber amplifier caused by a fluctuation in the diode laser characteristics and feeds back a signal into the laser diode at the correct phase to reduce the laser fluctuation. Unfortunately, this technique adds cost and complexity to the amplifier. It is preferable to employ a passive method of reducing diode laser fluctuations. An attractive solution is to feed back into the pump diode laser a portion of its own light. These lasers are very sensitive to optical feedback, and if such feedback is properly controlled, improved laser operation can result. Feedback is usually provided by an external reflector such as a mirror or diffraction grating, and external optical elements such as lenses are required to manipulate and guide the light out of an back into the diode laser cavity. Although the external optics and reflectors can often be quite compact, it is difficult and expensive to align such a system, and the mechanical and thermal stability can often be inadequate for use in fiber amplifiers and lasers. A more rugged technique for control of diode laser characteristics is required.

SUMMARY OF THE INVENTION

The present invention uses a fiber Bragg grating in a pigtailed diode laser to provide optical feedback into the cavity of a diode laser, thereby locking the frequency of the diode laser to that of the fiber grating, and reducing the longitudinal mode-hopping noise of the laser. A fiber Bragg grating is a periodic structure of refractive index variations in or near the guided-mode portion of the optical fiber that can reflect light of a certain wavelength propagating along the fiber. The reflected light propagates in the fiber in a direction opposite to that of the incident light. If a diode laser is pigtailed to a fiber containing a fiber Bragg grating, and if the centre of the grating bandwidth is within the gain bandwidth of the laser, then the optical spectrum of the diode laser will be affected. The exact effect depends on such parametres as the magnitude and bandwidth of the grating reflectivity, the centre wavelength of the grating relative to the laser, the magnitude of separation between the laser and grating, and the magnitude of injection current into the diode laser. In many cases, the laser characteristics can be improved a given application.

The apparatus according to the invention is formed by a diode laser, means for focusing the emission of the laser into a length of optical fiber, and a fiber grating formed in or near the guided wave portion of the optical fiber.

In one of its aspects, the invention consists of apparatus for generating a stable laser source having multiple longitudinal modes across a very narrow bandwidth. The apparatus comprises a diode laser that emits light in substantially a single spatial mode. An optical fiber is provided which is capable of guiding at least one mode of the diode laser in a portion of the fiber. Means are provided for directing the emitted light from the diode laser into the optical fiber. A fiber Bragg grating is formed in the region of the guided mode portion of the optical fiber.

DETAILED DESCRIPTION OF THE PREFERRED EMBODIMENT

The preferred embodiment of the invention will be described by reference to the drawings thereof wherein:

FIG. 1 is a schematic representation of a pigtailed diode laser associated with a fiber amplifier according to the prior art.

FIG. 2 is a schematic representation of a pigtailed diode laser according to the invention.

FIG. 3 is a graph comparing the output spectrum of a prior art pigtailed diode laser and of a pigtailed diode laser according to the invention.

FIG. 1 represents a fiber amplifier 10 including a pigtailed diode laser according to the prior art. Optical fiber 14 is doped with erbium (indicated by numerals 16) to provide amplifying effect and is coupled to undoped fiber 13. The amplifying effect may be achieved by exciting the erbium atoms with light at about 980 nm. This is achieved by coupling a 980 nm light source to the transmission light (at 1550 nm) from the transmission fiber 15 by means of an optoelectronic coupler 18.

The 980 nm light source is provided in the prior art by a pigtailed laser diode 20 consisting of a laser diode 22 coupled by lens 23 to undoped fiber 24. The limitations of prior art pigtailed laser diodes have been discussed above.

FIG. 2 is a schematic representation of a pigtailed diode laser according to the invention.

FIG. 3. is a graph comparing the output spectrum of a prior art pigtailed diode laser and of a pigtailed diode laser according to the invention.

FIG. 1 represents a fiber amplifier 10 including a pigtailed diode laser according to the prior art. Optical fiber 14 is doped with erbium (indicated by numerals 16) to provide amplifying effect and is coupled to undoped fiber 13. The amplifying effect may be achieved by exciting the erbium atoms with light at about 980 nm. This is achieved by coupling a 980 nm light source to the transmission light at 1550 nm) from the transmission fiber 15 by means of an opto-electronic coupler 18.

The 980 nm light source is provided in the prior art by a pigtailed laser diode 20 consisting of a laser diode 22 couple by lens 23 to undoped fiber 24. The limitations of prior art pigtailed laser diodes have been discussed above.

FIG. 2 illustrates a pigtailed laser diode according to the preferred embodiment of the invention. Diode laser 26 emits radiation in a single-spatial mode, and is typically fabricated with a quantum well epitaxial structure or index guided structure from InGaAs semiconductor material. The diode laser is most conveniently pumped by current injection. Diode lasers with the necessary characteristics are commercially available.

The diode laser 26 is configured to emit radiation primarily from the front facet 27. The divergent laser emission 28 is directed with focusing system 30 into the guided-mode portion of a length of optical fiber 32, containing an intracore fiber Bragg grating 34. The focusing system of the preferred embodiment consists of a lensing system represented as numeral 36 to focus the laser diode output into the fiber 32. Alternatively, the fiber can be placed in such proximity to the diode laser that a substantial portion of the emitted light is collected by the fiber.

The optical fiber 32 is typically fabricated from silica glass containing trace dopants to improve the light guiding characteristics of the fiber. The fiber grating 34 that provides optical feedback to the diode laser can be etched near the guided-mode portion of the fiber 34 using lithography techniques, or more commonly, can be created by exposing the fiber to a pattern of periodic intensity variation of high influence ultraviolet light. If the latter technique is employed to fabricate the grating, it is convenient if the fiber core has a concentration of germanium to render the core sensitive to the ultraviolet light that forms the grating. The fiber 34 may be one that sustain a single or multiple spatial modes at the wavelength of emission of the diode laser.

The fiber grating 34 is selected to have maximum reflectivity within 10 nm of the diode laser emission wavelength, and the reflectivity is similar to that of the exit facet of the diode laser. The bandwidth of the grating reflectivity is typically 0.05 nm to 2 nm. The system can operate successfully when the grating 34 and the laser diode 26 are separated by a few hundred micrometres to several kilometres provided the amount of optical feedback into the laser remains greater than a certain magnitude. Using such configuration, the diode laser has substantially improved characteristics suitable for pumping solid-state amplifiers or lasers.

The light captured by the fiber 34 would normally propagate down a length of the fiber indefinitely, limited only by the fiber loss characteristics. The fiber Bragg grating 34 is fabricated within the guided mode portion or core of this length of fiber. The grating is fabricated such that the wavelength of its maximum reflection is within the gain bandwidth of the diode laser. This grating reflects a fraction of the diode laser emission light back through the fiber and the focusing system into the diode laser. The remainder of the light output passes through the fiber grating and down the remaining length of fiber.

The effect of the fiber grating on the characteristics of the diode laser optical output is explained by considering the wavelength-dependent loss in the coupled cavity formed by the fiber grating. Those skilled in the art will appreciate that the optical feedback from the fiber grating effectively reduces the loss from the laser cavity of light within the bandwidth of the fiber grating. It is well known that the laser can operate preferentially near the wavelength of lowest loss, hence the wavelength of the diode laser can be sifted from its free running value to the wavelength of the fiber grating. This can occur if the wavelength of the fiber grating is within the gain bandwidth of the diode laser, provided the magnitude of reflectivity from the grating is sufficient.

The behavior of the diode laser under conditions of optical feedback is complicated by the effect of the diode laser cavity itself, which if formed by the end facets of the semiconductor chip. In the preferred embodiment of the invention, the reflectivity of the grating as well as its wavelength are selected such that the broadband feedback from the diode laser cavity is greater than the feedback from the fiber grating. In this circumstance, the feedback from the fiber grating acts as perturbation of the coherent electric field formed in the diode laser cavity. This perturbation acts to break the coherence of the diode laser emission, thus broadening the bandwidth of the emission by several orders of magnitude, resulting in a spectral distribution as shown in curve A of FIG. 3. The fiber Bragg grating effectively locks the diode cavity output to the fixed wavelength of the grating and centres the external cavity multi-longitudinal modes around that wavelength. The presence of the multi-longitudinal modes reduces the magnitude of mode-hopping noise in the diode laser. This is termed coherence collapse of the diode laser. In addition, the centre wavelength of emission remains near the wavelength of maximum reflection from the fiber grating. The diode laser is thus constrained to operate within the grating bandwidth, so that large fluctuations in wavelength of the diode laser caused by changes in temperature or current are eliminated. Additionally, the laser is not perturbed by extraneous optical feedback from reflective components located beyond the fiber grating, provided the extraneous feedback is less than that provided by the fiber grating.

A diode laser in accordance with the present invention does not undergo transitions of single longitudinal laser cavity modes as are observed in free-running diode laser. Such transitions cause large intensity fluctuations in the diode laser output caused by competition between two modes during the transition. These mode transitions are caused by changes in laser injection current or temperature, for example, and are detrimental to the operation of an optical amplifier or fiber laser. The optical output of the invention consists of twenty or more longitudinal modes of the external cavity. Although the partitioning of optical power between the modes may change, there is much less fluctuation in laser intensity compared to that of a single mode, free-running diode laser.

The output power from the end of the fiber of the diode laser system is only slightly affected by the presence of the grating in the fiber. For weakly reflecting gratings, the output power from the fiber is reduced approximately by $(1-R_g)$ where $R_g$ is the maximum reflectivity of the grating. The injection current at laser threshold is slightly reduced by the presence of the grating. This effect increases the output power from the fiber and counteracts the aforementioned reduction of power.

The scope of the invention comprises a system in which the fiber grating is an arbitrary length from the diode laser. However, the magnitude of this length affects the operation of the diode laser. To ensure the maintenance of the coherence collapse of the laser emission, the fiber grating is located at a sufficient optical distance from the front facet of the diode laser. This distance must be much longer than the coherence length of the diode laser under the prescribed conditions of optical feedback, so that optical feedback from the fiber grating remains incoherent, thus assuring the laser remains in a state of coherence collapse. If the grating is placed within a few centimeters or less of the diode laser, then the feedback from the fiber grating may be coherent with the electric field inside the laser cavity, and very narrow linewidth operation of the diode laser will result. Such emission is very useful for some applications but is much less stable for the application of pumping fiber amplifiers or lasers because of the onset of laser cavity-mode transition noise when the laser operating characteristics change. In addition, there are still transitions from coherent to incoherent operation of the diode laser which cause intensity fluctuations which are detrimental to the operation of optical fiber amplifiers and lasers.

The present invention employs low-birefringent optical fiber that cannot maintain the polarization of the electromagnetic field in the guided region if the fiber is stressed. Accordingly, if the fiber experiences stress from bending, for example, the polarization of the light that propagates down the fiber and which is reflected back into the diode laser is of a different state of polarization than that which is emitted from the laser. The diode laser does not respond as effectively to optical feedback of different polarization, and the characteristics of the diode laser system may not be optimum. However, for cavity length of a few metres or less and bend radii of greater than 10 cm, it is typically found that the characteristics of the laser system remain sufficient to exhibit the improvements that have been so far described. Accordingly, the invention requires no provision for polarization control of the optical feedback.

In the preferred embodiment of the invention, a strained-layer InGaAs multiquantum well diode laser is coupled to the optical fiber with an aspheric lens systems with efficiency of 60%. The efficiency of 60%. The laser emits light at 965–1025 nm, typically. The fiber grating has a reflection bandwidth of 0.2–0.3 nm and a peak reflectivity of approximately 3%. Accordingly, the effective reflectivity $R_{eff}$ seen by the fiber grating is in general $$R_{eff} = \eta 2 R_g$$

where $\eta$ is the coupling efficiency of the light from the solitary diode laser into the optical fiber, and $R_g$ is the maximum reflectivity of the fiber grating. For the specific values, for example, $(0.6)^2(3\%)=1.08\%$. This compares to the front facet of the diode laser, which has a nominal reflectivity of 4%. This level of optical feedback is sufficient to maintain the coherence collapse of the diode laser while allowing sufficient light to pass through the fiber grating, thus maximizing the available power. The wavelength of the grating reflectivity nominally lies within 10 nm of the wavelength of the diode laser. The grating is 1–2 mm in wavelength of the diode laser. The grating is 1–2 mm in length. To ensure the maintenance of the coherence collapse of the laser emission, the fiber grating is located at least 50 cm from the front facet of the diode laser. If it is desirable to maintain the coherence of the laser system, the fiber grating should be located as close as possible to the exit facet of the diode laser, and certainly not more than a few centimetres away.

The output power from the optical fiber in the preferred embodiment is at most reduced by a few percent. For a 150 Mw diode laser pigtailed with a fiber containing a fiber grating with peak reflectivity of 3%, the output power from the fiber may exceed 90 Mw which is similar to that from a fiber with no grating, within experimental uncertainty.

FIG. 3 illustrates the optical output spectrum of the present invention. As can be seen, curve B is the output spectrum of a 980 nm InGaAs pigtailed diode laser without a fiber grating. There is approximately 0.5% feedback into the diode laser from a broadband external reflector, which causes destabilization of the laser wavelength. In curve A, the diode laser operates under the same conditions, but there is a fiber grating with a peak reflectivity of 3% and a bandwidth of 0.3 nm. The improvement of the output spectrum is clear. The output of the invention is stable even when the injection current or temperature of the laser diode are significantly altered. Accordingly, no control of the laser diode temperature is required in some instances, which eliminates the need of a laser cooler and the associated control electronics. The power requirement to control the laser temperature is also suitably reduced.

It should now be evident that the present invention provides a highly stabilized source of high-power optical radiation that will improve the characteristics and stability of optical amplifiers and lasers that must be pumped with such a source.

Although the preferred embodiment has been described in relation to its use with a fiber amplifier in the reference to FIG. 1, it will be appreciated by those skilled in the art that it could also be used in association with a fiber laser.

What is claimed is:

1. A stable laser source apparatus comprising:
   a semiconductor laser halving a first optical cavity and having an output;
   at least a first reflecting component in said first optical cavity and having a first reflectivity level;
   an optical fiber optically coupled to said first cavity;

a reflective element accompanying said optical fiber and together therewith forming a second optical cavity, said reflective element having a supplemental reflectivity level for reflecting a portion of said output over a narrow band of wavelengths back into said first cavity said supplemental reflectivity level approximately equal to or less than said first reflectivity level;

said semiconductor laser having a gain band at least a portion of which overlaps with said reflective element reflectivity band;

said reflective element locking the output from said semiconductor laser to a fixed wavelength of said reflective element around which are established a plurality of multi-longitudinal modes in said second optical cavity collapsing the coherence operation of said semiconductor laser resulting in a reduction of the magnitude of noise in laser operation.

2. The apparatus according to claim 1 further comprising an fiber amplifier energized by the output from the laser source apparatus.

3. The apparatus according to claim 2 wherein said fiber amplifier is an erbium doped amplifier for amplifying a signal around 1530 nm to 1565 nm.

4. The apparatus according to claim 3 wherein diode laser is a Group III–V compound semiconductor laser with an output around 980 nm.

5. A stable laser source apparatus comprising:

a gain medium having a first optical cavity;

a first reflecting component at one end of said first optical cavity and having a first reflectivity level for reflecting a portion of propagating light in said first optical cavity back into said cavity, said first reflective component also providing a light output;

an optical fiber optically coupled to said first cavity to receive said light output;

a second reflecting component accompanying said optical fiber, said second reflecting component having a second reflectivity level for reflecting a portion of said output over a narrow band of wavelengths back into said first optical cavity;

said second reflectivity level approximately equal to or less than said first reflectivity level;

said second reflecting component positioned in said optical fiber a distance from said first optical cavity sufficient to induce incoherent feedback for constraining said gain medium to function in multiple longitudinal mode operation suppressing the magnitude of noise in the gain medium.

6. The apparatus of claim 5 wherein said second reflecting component is positioned beyond the coherence length of said laser.

7. The apparatus of claim 5 wherein said gain medium is a semiconductor laser having a gain band at least a portion of which overlaps with said reflectivity band.

8. The apparatus of claim 7 wherein said semiconductor laser has an InGaAs strained layer quantum well gain medium.

9. The apparatus of claim 7 wherein said semiconductor laser has a gain band at least a portion of which overlaps with a narrow band of wavelengths reflected by said second reflecting component.

10. The apparatus of claim 9 wherein said overlap stabilizes the operational wavelength of said laser over a range of operating conditions.

11. The apparatus of claim 10 wherein at least one of said operating conditions is a change in ambient temperature.

12. The apparatus of claim 5 wherein said optical fiber is a single mode fiber.

13. The apparatus of claim 5 wherein said second reflecting component has a reflectivity peak which is within 10 nm of the peak gain of said gain medium.

14. The apparatus of claim 5 wherein said second reflecting component is positioned a distance beyond the coherence length of said gain medium.

15. The apparatus of claim 5 further comprising an optical fiber amplifier coupled to an output end of said optical fiber, said second reflectivity level is less than said first reflectivity level but of sufficient magnitude to be in excess of the intensity level of any extraneous feedback received from said fiber output.

16. A stable laser source apparatus comprising:

a laser source having an output facet providing optical feedback and for providing an output;

an optical fiber having an end coupled to receive said laser source output;

a grating in said fiber providing a bandwidth including wavelengths that are at least partially overlapping a wavelength emission spectrum of said laser source, absent said grating;

said bandwidth partially reflected by said grating to provide optical feedback into said laser source;

separation between said grating and laser source and magnitude of optical feedback from said grating being selected such that said laser source is constrained to operate at the peak wavelength of said grating and within the multiple longitudinal modes of the grating bandwidth suppressing the magnitude of noise emitted from said laser source when said laser source is operated in absence of said grating.

17. The apparatus of claim 16 wherein an effective reflectivity of said grating is less than or equal to an effective reflectivity provided by said laser source output facet.

18. The apparatus of claim 16 wherein said grating bandwidth is between about 0.5 nm and about 1 nm.

19. The apparatus of claim 16 wherein a distance between said fiber grating and said laser source output facet is less than several meters.

20. The apparatus of claim 19 wherein said spatial distance is between about 50 centimeters and several meters.

21. The apparatus of claim 16 wherein a distance between said fiber grating and said laser source is longer than a distance causing coherence collapse.

22. The apparatus of claim 16 wherein a distance between said fiber grating and said laser source is less than the coherence length of said laser source.

23. The apparatus of claim 16 wherein said optical fiber has low birefringence so that it is polarization insensitive.

24. The apparatus of claim 23 wherein said optical fiber is polarization insensitive when stressed.

25. The apparatus of claim 16 wherein said grating controls said output to be at a wavelength within an absorption band of a solid state gain medium.

26. The apparatus of claim 25 wherein said solid state gain medium includes a fiber amplifier.

27. The apparatus of claim 25 wherein said solid state gain medium includes a fiber laser.

28. A stabized laser source comprising:

a laser source having an optical cavity and providing an output at a facet;

said facet having a first reflectivity level;

an optical fiber optically coupled to the laser source optical cavity;

a second reflective element in said optical fiber, said reflective element having a second reflectivity level for reflecting a portion of the laser source output over a narrow band of wavelengths back into the laser source optical cavity;

characterized in that said second reflective element is positioned along said optical fiber from the laser source facet a distance from the laser source facet that provides incoherent feedback to the laser source inducing coherence collapse operation in the laser source.

29. The stabilized laser source of claim 28 wherein said second reflective element has a bandwidth between about 0.5 nm and about 1 nm.

30. The stabilized laser source of claim 28 wherein said the distance is preferably greater than a coherence length of the laser source.

31. A stabilized laser source for a fiber amplifier comprising:

a laser source having an optical cavity and providing an output at a facet, said laser source operating in multiple longitudinal modes;

an optical fiber optically coupled at one end to the optical cavity;

said optical fiber coupled at its other end to the fiber amplifier;

a fiber grating in said fiber to provide feedback to said laser source;

changes in longitudinal modal operation of said laser source in the absence of said grating creating noise in the operation of the fiber amplifier;

characterized in that the fiber grating is positioned in the fiber a distance from the laser source facet that provides for incoherent feedback to the laser source causing coherence collapse operation in the laser source to suppress the occurrence of noise due to said longitudinal modal operation changes in the absence of said grating.

32. The stabilized laser source of claim 31 wherein said fiber amplifier is an erbiun doped fiber.

33. The stabilized laser source of claim 31 wherein said fiber grating has a bandwidth between about 0.5 nm and about 1 nm.

34. The stabilized laser source of claim 31 wherein said grating distance in said fiber is preferably equal to or greater than the coherence length of the laser source.

* * * * *